US006954375B2

(12) United States Patent
Ohmori

(10) Patent No.: US 6,954,375 B2
(45) Date of Patent: Oct. 11, 2005

(54) MAGNETIC STORAGE ELEMENT, RECORDING METHOD USING THE SAME, AND MAGNETIC STORAGE DEVICE

(75) Inventor: Hiroyuki Ohmori, Kanagawa (JP)

(73) Assignee: Sony Corporation, Tokyo (JP)

( * ) Notice: Subject to any disclaimer, the term of this patent is extended or adjusted under 35 U.S.C. 154(b) by 155 days.

(21) Appl. No.: 10/706,363

(22) Filed: Nov. 12, 2003

(65) Prior Publication Data

US 2004/0136234 A1 Jul. 15, 2004

(30) Foreign Application Priority Data

Nov. 15, 2002 (JP) ............................ P2002-332562

(51) Int. Cl.⁷ ............................................. G11C 11/15
(52) U.S. Cl. .................. 365/173; 365/171; 365/97; 365/74; 365/66; 365/63; 365/51; 365/55; 365/48
(58) Field of Search ................................ 365/173, 171, 365/97, 74, 66, 63, 51, 55, 48

(56) References Cited

U.S. PATENT DOCUMENTS

| | | | | |
|---|---|---|---|---|
| 5,473,492 A | * | 12/1995 | Terunuma et al. | 360/319 |
| 5,726,837 A | * | 3/1998 | Nakatani et al. | 360/324.2 |
| 6,134,091 A | * | 10/2000 | Toki et al. | 360/324.11 |
| 6,313,973 B1 | * | 11/2001 | Fuke et al. | 360/324.1 |
| 6,392,850 B1 | * | 5/2002 | Tong et al. | 360/315 |
| 6,452,204 B1 | * | 9/2002 | Ishiwata et al. | 257/9 |
| 6,661,071 B2 | * | 12/2003 | Lenssen et al. | 257/422 |
| 6,687,099 B2 | * | 2/2004 | Nakatani et al. | 360/324.2 |
| 6,757,143 B2 | * | 6/2004 | Tunayama et al. | 360/324.1 |
| 2001/0004306 A1 | * | 6/2001 | Lee et al. | 360/244 |
| 2003/0206379 A1 | * | 11/2003 | Lin et al. | 360/319 |
| 2004/0022155 A1 | * | 2/2004 | Oshima | 369/53.21 |

* cited by examiner

Primary Examiner—Viet Q. Nguyen
(74) Attorney, Agent, or Firm—Sonnenschein, Nath & Rosenthal LLP

(57) ABSTRACT

A magnetic storage element and a recording method using the same capable of ensuring correct information recording without causing erroneous writing are proposed. A magnetic storage device having the magnetic storage elements incorporated therein, and being capable of recording information in a stable and correct manner even if the magnetic characteristics vary from the element to element is also proposed. The magnetic storage element comprises a storage layer, magnetic field applying means for applying magnetic field to the storage layer, and a magnetic field shield, disposed between the magnetic field application means and the storage layer, comprising a soft magnetic material, for shielding at least a part of the magnetic field. Recording to the magnetic storage element is made effective by applying a magnetic field to the storage layer while heating the magnetic field shield to thereby allow it to reduce or lose its magnetization.

7 Claims, 11 Drawing Sheets

MAGNETIC STORAGE ELEMENT, RECORDING METHOD USING THE SAME, AND MAGNETIC STORAGE DEVICE

CROSS REFERENCES TO RELATED APPLICATIONS

The present invention claims priority to its priority document No. 2002-332562 filed in the Japanese Patent Office on Nov. 15, 2002, the entire contents of which being incorporated by reference herein.

BACKGROUND OF THE INVENTION

1. Field of the Invention

The present invention relates to a magnetic storage element preferably applicable to a non-volatile memory, a recording method using the same, and a magnetic storage device using the magnetic storage element.

2. Description of Related Art

In information apparatuses such as computers, a DRAM which is operable at a high speed and having a large storage density is widely used as random access memories therefor. The DRAM is however classified as a volatile memory which cannot keep information when the power supply is interrupted, so that there is a demand for non-volatile memory which can keep information at any time.

One example of the non-volatile memory relates to a magnetic random access memory (MRAM) which uses magnetic storage elements capable of recording information based on a magnetization state of a magnetic material (see non-patent document 1, for example).

[Non-Patent Document 1]

Nikkei Electronics, Feb. 12, 2001 (p.164–171)

The above-described MRAM is configured as a magnetic storage device in which two kinds of wirings (a word line and a bit line, for example) crossing normal to each other are individually formed plural in number, and a magnetic storage element is provided at every intersection of these two wirings, so that a large number of magnetic storage elements are arranged according to a matrix pattern. Information is recordable by electrifying a specific line respectively selected from these two kinds of wirings to thereby select a magnetic storage element located at the intersection of both activated lines, and by inverting the magnetization of a storage layer of the selected magnetic storage element by a current-induced magnetic field.

Any variations in the magnetic characteristics of the individual magnetic storage elements composing the MRAM may however cause magnetization inversion also in magnetic storage elements other than targeted ones (those to be recorded), and this undesirably prevents correct recording. On the contrary, weakening of the current-induced magnetic field to a sufficiently low level aiming at completely prevent the magnetic storage elements other than the targeted ones from causing the magnetization inversion may fail in recording for a part of the targeted magnetic storage elements.

Because trends for the future require the MRAM to further raise density for a larger storage capacity, and to reduce size of the magnetic storage element composing memory cells thereof, it is also necessary to reduce size of the magnetic material used for the storage layer of the magnetic storage element.

The magnetic material, however, tends to increase its coercive force as the size thereof is reduced, and this inevitably raises a coercive force of the storage layer also in the magnetic storage elements of the MRAM with progress of the size reduction. This type of increase in the coercive force makes it difficult to reduce variations in the coercive force of the individual magnetic storage elements.

SUMMARY OF THE INVENTION

To solve the aforementioned problems, the present invention is to provide a magnetic storage element and a recording method using the same capable of ensuring correct information recording without causing erroneous writing. The present invention is also to provide a magnetic storage device having the magnetic storage elements incorporated therein, and being capable of recording information in a stable and correct manner even if the magnetic characteristics vary from the element to element.

The magnetic storage element of the present invention comprises a storage layer for storing a magnetization state as information; magnetic field applying means for applying a magnetic field to the storage layer; and a magnetic field shield, being disposed between the magnetic field applying means and the storage layer and comprising a soft magnetic material, for shielding at least a part of the magnetic field applied by the magnetic field applying means.

The recording method of the present invention is used for a magnetic storage element comprising a storage layer for storing a magnetization state as information; magnetic field applying means for applying a magnetic field to the storage layer; and a magnetic field shield, being disposed between the magnetic field applying means and the storage layer and comprising a soft magnetic material, for shielding at least a part of the magnetic field applied by the magnetic field applying means; wherein the recording of the magnetization state to the storage layer is made effective by applying the magnetic field by the magnetic field applying means to the storage layer while heating the magnetic field shield to thereby allow it to reduce or lose at least a part of the magnetization of the magnetic field shield.

A magnetic storage device of the present invention comprises a magnetic storage element comprising a storage layer for storing a magnetization state as information, magnetic field applying means for applying a magnetic field to the storage layer, and a magnetic field shield, being disposed between the magnetic field applying means and the storage layer and comprising a soft magnetic material, for shielding at least a part of the magnetic field applied by the magnetic field applying means; a first wiring; and a second wiring; wherein the magnetic storage element is disposed at an intersection of the first wiring and the second wiring, where the first wiring configures the magnetic field applying means of the magnetic storage element, from the first wiring a current-induced magnetic field is applied to the storage layer; and the magnetic field shield is heated by the second wiring.

The above-described magnetic storage device of the present invention may also have a magnetic storage element group configured therein, which magnetic storage element group comprises a plurality of the magnetic storage elements which are individually provided with the magnetic field shields differing in configurations thereof from each other, and being configured so as to be heated by the second wiring provided in common.

According to the configuration of the above-described magnetic storage element of the present invention characterized by having a storage layer for storing a magnetization state as information; magnetic field applying means for applying a magnetic field to the storage layer; and a magnetic field shield, being disposed between the magnetic field applying means and the storage layer and comprising a soft magnetic material, for shielding at least a part of the magnetic field applied by the magnetic field applying means, the magnetic field shield reduces or loses its magnetization when it is heated to as close to a magnetic transition temperature of the soft magnetic material composing the magnetic field shield, to thereby reduce or lose its shielding ability, and this consequently allows the storage layer to be applied with a sufficient intensity of the magnetic field from the magnetic field applying means, and to be recorded with information.

On the contrary, when the magnetic field shield is not heated, at least a part of the magnetic field from the magnetic field applying means is shielded by the magnetic field shield to thereby weaken the magnetic field to be applied to the storage layer, and this allows the storage layer to remain unchanged in the magnetization and unrecorded.

It is therefore made possible to selectively effect recording to the storage layer by selecting presence or absence of heating of the magnetic field shield, and presence or absence of generation of the magnetic field by the magnetic field applying means.

According to the recording method of the magnetic storage element of the present invention, the magnetization state can be recorded to the storage layer by applying the magnetic field by the magnetic field applying means to the storage layer while heating the magnetic field shield to thereby allow it to reduce or lose at least a part of the magnetization of the magnetic field shield. On the contrary, when the magnetic field shield is not heated, the component can shield the magnetic field from the magnetic field applying means to thereby allow the storage layer to remain unchanged in the magnetization, and thus can prevent erroneous recording to the storage layer.

In short, heating of the magnetic field shield under generation of the magnetic field from the magnetic field applying means enables recording to the storage layer, and on the other hand, absence of the heating can prevent erroneous recording to the storage layer. This makes it possible to selectively effecting recording to the storage layer in a stable and correct manner.

According to the configuration of the above-described magnetic storage device of the present invention characterized by having the above-described magnetic storage element of the present invention, the first wiring and the second wiring, and wherein the magnetic storage element is disposed at the intersection of the first wiring and second wiring, the first wiring configures the magnetic field application means of the magnetic storage element, from the first wiring the current-induced magnetic field being applied to the storage layer; and the magnetic field shield is heated by the second wiring, it is made possible to carry out recording to the magnetic storage element based on the recording method described in the above.

In other words, the magnetization state (information) can be recorded into the storage layer through applying a current-induced magnetic field by the first wiring to the storage layer, while heating the magnetic field shield by the second wiring so as to allow it to reduce or lose at least a part of the magnetization of the magnetic field shield, to thereby vary direction of the magnetization of the storage layer.

Whilst a magnetic storage element, having both of correspondent first wiring and second wiring being selected, is successful in information recording as described in the above, a magnetic storage element, having correspondent second wiring being not selected, does never cause erroneous recording, because the magnetic field shield is not heated, thus shields at least a part of the current-induced magnetic field from the first wiring to thereby reduce the current-induced magnetic field to be applied to the storage layer, and is not causative of changes in a direction of the magnetization of the storage layer. That is, erroneous writing will never occur in any magnetic storage elements other than selected ones.

The recording herein is based on reduction in shielding ability of the magnetic field shield through heating by the second wiring, so that recording to the storage layer can always be ensured even if a coercive force of the storage layers varies among the magnetic storage elements, because the shielding ability of the magnetic field shield can surely be reduced by the heating. As a consequence, the present invention is successful in configuring a magnetic storage device less likely to be affected by variation in magnetic characteristics (coercive force, etc.) of the magnetic storage elements.

For the case where the magnetic storage device of the present invention is configured to have a magnetic storage element group configured therein, wherein the magnetic storage element group comprises a plurality of the magnetic storage elements which are individually provided with the magnetic field shield differing in configurations thereof from each other, and is configured so as to be heated by the second wiring provided in common, it is possible to vary the number of magnetic field shield which exhibit the shielding ability out of those having different configurations, and to consequently vary the number of magnetic storage elements to be recorded in the storage layer thereof with the magnetization state out of those composing the magnetic storage element group, by adjusting the amount of current to be supplied through the second wiring to thereby control temperature of the magnetic field shield.

Thus multi-step recording while varying the number of elements to be recorded in the storage layer thereof with the magnetization state makes it possible to effect arbitrary recording to a plurality of magnetic storage elements composing the magnetic storage element group.

BRIEF DESCRIPTION OF THE DRAWINGS

The above and other objects, features and advantages of the present invention will become more apparent from the following description of the presently preferred exemplary embodiment of the invention taken in conjunction with the accompanying drawings, in which.

DETAILED DESCRIPTION OF THE PREFERRED EMBODIMENTS

Figure 1:
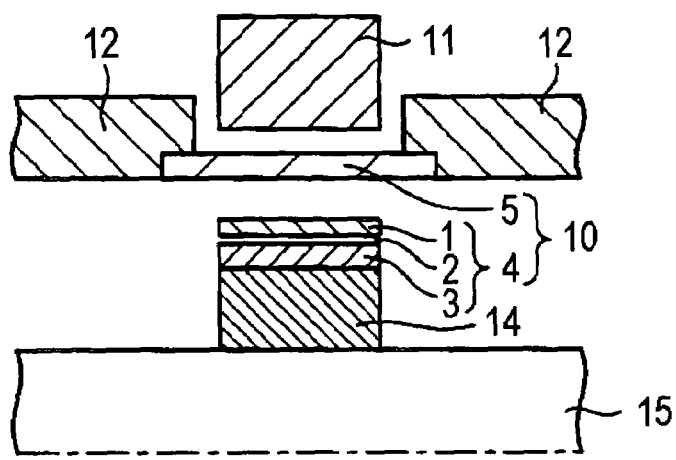
FIG. 1 is a schematic drawing (sectional view) showing a configuration of a magnetic storage element according to one embodiment of the present invention.

A schematic drawing (sectional view) of a configuration of a magnetic storage element according to one embodiment of the present invention is shown in FIG. 1.

In the magnetic storage element 10, a storage layer 1 in which information is recorded based on a direction of magnetization and a pinned layer 3 having a fixed direction of magnetization are disposed while placing a tunnel insulating film 2 in between, to thereby configure a magnetic tunnel junction element (MTJ) 4.

The magnetic tunnel junction element 4 is disposed so that a lateral direction of the drawing is aligned with an easy axis of magnetization of the magnetic layers 1, 3, and a direction perpendicular to the sheet is aligned with a hard axis of magnetization thereof.

The pinned layer 3 comprises a stacked film of a ferromagnetic layer and an antiferromagnetic layer, although not shown, and the antiferromagnetic layer fixes the direction of magnetization of the ferromagnetic layer in a unidirectional manner. The pinned layer 3 has a conductor (electrode) 14 connected on a bottom surface thereof, and through the conductor 14, is electrically connected to an underlying semiconductor substrate 15. The semiconductor substrate 15 has element selection transistors and driver transistors for electrifying wirings and the like formed thereon.

In the magnetic storage element 10 of the present embodiment, a magnetic field shield 5 is specifically provided above the storage layer 1. The magnetic field shield 5 is composed of a soft magnetic material, and is provided so as to shield a part of or entire portion of a magnetic field to be applied to the storage layer 1.

For the magnetic field shield 5, it is preferable to use a soft magnetic material which shows magnetic transition at an appropriate temperature at or above an operation temperature of the magnetic storage element 10. Examples of magnetic transition available herein include those occur at the Curie temperature of NiFe alloys, and compensation temperature of a ferrimagnetic material such as GdFeCo alloys.

It is to be noted, however, that too high magnetic transition temperature needs a large current to be supplied to the second wiring 12 for heating, and this undesirably increases power consumption. It is thus preferable to use, for example, an NiFe alloy added with an additive such as Cr or Mn to thereby lower the Curie temperature thereof, or to use an amorphous alloy such as a CoFeSiB alloy of which the Curie temperature is variable with the composition thereof for the magnetic field shield 5.

The soft magnetic material used for the magnetic field shield 5 may be composed as a single layer, or as a multi-layered structure such as three-layered structure incorporating an intermediate non-magnetic layer placed therebetween in order to suppress formation of magnetic domain.

A little distant from the magnetic field shield 5, a first wiring 11 is disposed so as to extend in the direction perpendicular to the sheet of drawing (direction of a hard axis of magnetization), and a second wiring 12 extending in a lateral direction (direction of an easy axis of magnetization) is electrically connected to both lateral ends of the magnetic field shield 5. Electrification of the first wiring 11 can generate a right-handed or left-handed current-induced magnetic field around it. On the other hand, electrification of the second wiring 12 can also supply current to the magnetic field shield 5 to thereby heat it, and can raise a temperature of the magnetic field shield 5.

In general, the soft magnetic material is likely to be magnetized, reduces its magnetization as the temperature rises, and loses its magnetization as the temperature further rises to convert itself into a non-magnetic material. The magnetic field shield 5 composed of the soft magnetic material therefore has properties as described in the next. The magnetic field shield 5 is likely to be magnetized at around a room temperature, and is magnetized by a current-induced magnetic field from the first wiring 11 to thereby shield at least a part of the current-induced magnetic field.

The magnetic field shield 5, however, becomes less likely to be magnetized and finally becomes non-magnetic when the temperature thereof is elevated by heating, and no more shields the current-induced magnetic field from the first wiring 11. By making use of these properties, it is made possible to partially or completely shield the current-induced magnetic field from the first wiring 11 at around room temperature, and to sufficiently apply the current-induced magnetic field from the first wiring 11 to the storage layer 1 without shielding it under elevated temperatures.

Figure 2A:
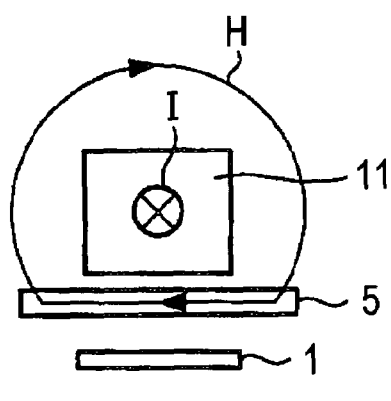
FIGS. 2A and 2B are drawings for explaining recording operation of the magnetic storage element shown in FIG. 1.
Figure 2B:
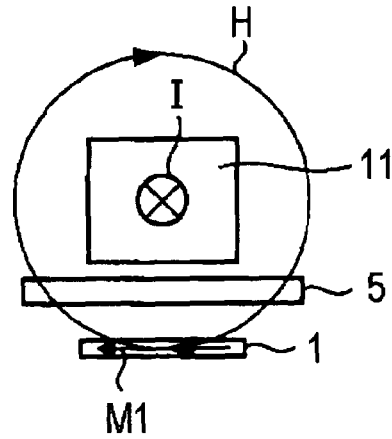

Next paragraphs will describe a method of recording information into thus-configured magnetic storage element 10 of the present embodiment referring to FIGS. 2A and 2B. It is to be noted that FIGS. 2A and 2B shows only the first wiring 11, the magnetic field shield 5 and the storage layer 1 in an extracted manner.

When current is supplied through the first wiring 11 while keeping the magnetic field shield 5 unheated, the current I flowing in the first wiring 11 (in the going-off direction perpendicular to the sheet of drawing) generates a clockwise current-induced magnetic field therearound as shown in FIG. 2A, and a line of the magnetic force H of the current-induced magnetic field passes through the magnetic field shield 5 which comprises a soft magnetic material. This reduces magnetic flux which can flow in the storage layer 1, and is not causative of magnetization inversion in the storage layer 1.

On the contrary, when the current I is supplied (in the going-off direction perpendicular to the sheet of drawing) through the first wiring 11 while heating the magnetic field shield 5 at a temperature equal to or higher than the Curie temperature thereof, the magnetic field shield 5 loses its magnetization to become non-magnetic, and this prevents the line of the magnetic force H of the current-induced magnetic field from being concentrated to the magnetic field shield 5, and instead allows it to penetrate the magnetic field shield 5 to reach the storage layer 1 as shown in FIG. 2B. This allows the storage layer 1 to be applied with a sufficiently large current-induced magnetic field, causes magnetization inversion in the storage layer 1, and makes the magnetization M1 of the storage layer 1 left-handed.

Inversion of the magnetization M1 of the storage layer 1 into right-handed one as viewed in the drawing will be successful by heating the magnetic field shield 5 at a temperature not lower than the Curie temperature thereof, and by electrifying the first wiring 11 in the coming-out direction perpendicular to the sheet of drawing. In this way, right-handed or left-handed magnetization information is recorded into the storage layer 1 corresponding to the information to be recorded therein.

In the magnetic storage element 10 of the present embodiment, the magnetic field shield 5 is heated by electrifying the second wiring 12 as shown in FIG. 1. The magnetic field shield 5 is therefore heated when a sufficient amount of current is supplied both to the first wiring 11 and the second wiring 12 as shown in FIG. 2B, and this applies a current-induced magnetic field to the storage layer 1 and allows recording of a magnetization state to the storage layer 1.

On the other hand, the magnetic field shield 5 does not reach the Curie temperature when no current, or only a small amount of current is supplied through the second wiring 12, so that a part of or entire portion of the current-induced magnetic field from the first wiring 11 is shielded by the magnetic field shield 5 as shown in FIG. 2A.

Although the above description on the recording operation dealt with the case where the recording is made effective only after the magnetic field shield 5 is heated to reach the Curie temperature thereof, it may be possible to invert magnetization of the storage layer 1 to thereby effect the recording without heating the magnetic field shield 5 not lower than the Curie temperature thereof in some cases depending on relation between magnitude of the current-induced magnetic field from the first wiring 11 and the coercive force of the storage layer 1.

In such cases, the magnetic field shield 5 reduces its magnetization under heating to thereby weaken the shielding ability thereof, and this enhances the current-induced magnetic field applied from the first wiring 11 to the storage layer 1, and thus makes it possible to invert magnetization of the storage layer 1 and enables information recording into the storage layer 1. Also making use of the above-described compensation temperature of ferrimagnetic material as the magnetic transition temperature, in place of Curie point, is successful in recording operation in a similar manner.

The magnetization information recorded in the storage layer 1 can be detected (read out) similarly to a magnetic storage element used in a conventional MRAM. More specifically, resistivity against tunnel current flowing in the tunnel insulating film 2 varies depending on whether a direction of a magnetization M1 of the storage layer 1 and a direction of q magnetization of the pinned layer 3 are in a parallel (identical) or anti-parallel (inverse) relation, so that magnetization information recorded in the storage layer 1 can be detected based on the resistivity value or the current value.

According to the above-described magnetic storage element 10 of the present embodiment characterized in having the magnetic field shield 5 between the storage layer 1 and the first wiring 11 for applying the current-induced magnetic field to the storage layer 1, lines of the magnetic force of the current-induced magnetic field from the first wiring 11 can be concentrated by the magnetic field shield 5 into itself at around the room temperature. This results in partial or complete shielding of the current-induced magnetic field, weakens the current-induced magnetic field to be applied to the storage layer 1, and consequently causes magnetic inversion of the storage layer 1.

On the other hand, when electric current is supplied to the second wiring 12 so as to electrify the magnetic field shield 5 to heat it, the heated magnetic field shield 5 will reduce or lose its magnetization and lower its shielding ability, so that the storage layer 1 will have a sufficiently larger current-induced magnetic field applied thereto, will cause magnetic inversion, and will have information recorded therein.

Electrification of the first wiring 11 and second wiring 12 at the same time activates the above-described recording operation. In contrast, electrification only of the first wiring 11 does not activate recording to the storage layer 1 because a part of or entire portion of the current-induced magnetic field from the first wiring 11 is shielded by the magnetic field shield 5 so as to reduce the current-induced magnetic field to be applied to the storage layer 1. Electrification only of the second wiring 12 again does not activate recording to the storage layer 1 even though the shielding ability of the magnetic field shield 5 is reduced or lost under heating, because the current-induced magnetic field cannot be produced from the first wiring 11.

As described in the above, recording to the storage layer 1 never occurs unless both of the first wiring 11 and the second wiring 12 are electrified at the same time. Assuming now that the magnetic storage device is composed of a plurality of magnetic storage elements 10, proper selection of the first wiring 11 and the second wiring 12 to be electrified reduces shielding ability of the magnetic field shield 5 of one selected magnetic storage element 10 located at an intersection of the selected first wiring 11 and second wiring 12 through heating of thus-electrified second wiring 12, so that the storage layer 1 of thus-selected element can be applied with a sufficient intensity of the current-induced magnetic field from the first wiring 11, and can be recorded even if some variations of the coercive force reside therein.

On the other hand, other non-selected magnetic storage elements 10 will never cause inversion of magnetism in the storage layers 1 thereof, and this ensures correct recording without erroneous writing. In this configuration, magnetic storage elements 10 to be recorded and magnetic storage elements 10 not to be recorded can correctly be selected through selection of the first wiring 11 and second wiring 12, even if some variations of the coercive force reside in the storage layer 1.

As a consequence, use of the magnetic storage element 10 of the present embodiment makes it possible to configure a magnetic storage device capable of ensuring stable and correct information recording.

It is also made possible to configure a magnetic storage device such as MRAM by disposing the magnetic storage elements 10 of the present embodiment at intersections of a plurality of first wirings 11 and a plurality of second wirings 12 orthogonally arranged in a matrix pattern.

Figure 3:
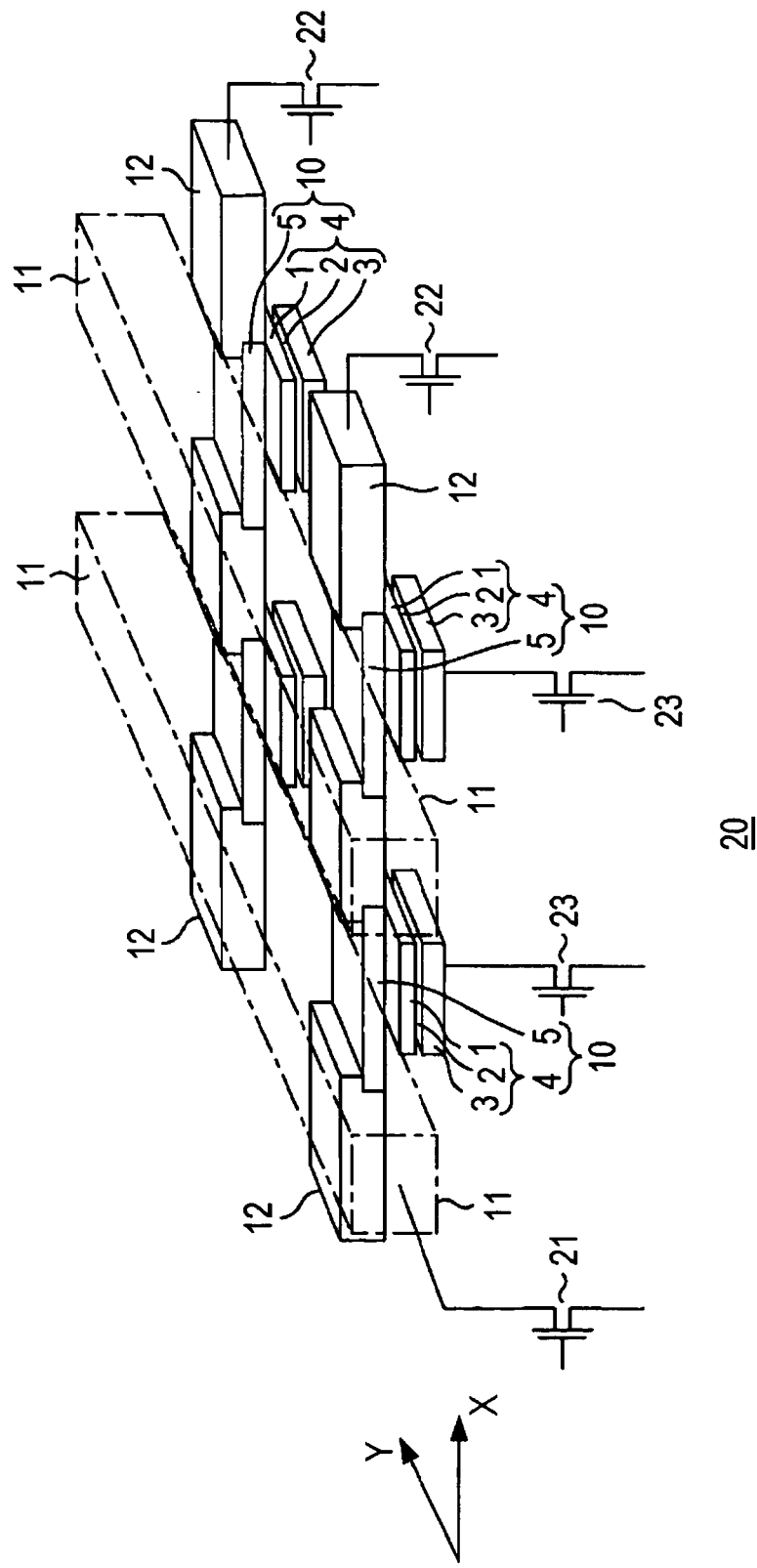
FIG. 3 is a schematic drawing (perspective view) showing a configuration of a magnetic storage device using the magnetic storage element shown in FIG. 1.

Next, as one embodiment of the magnetic storage device of the present invention, FIG. 3 shows a schematic drawing (perspective view) of a configuration of a magnetic storage device using the magnetic storage element 10 of the aforementioned embodiment. Out of a great number of arrayed magnetic storage elements 10, FIG. 3 herein shows only two in the vertical direction by two in the lateral direction.

As shown in FIG. 3, the magnetic storage device 20 is configured by disposing the magnetic storage elements 10 individually having a rectangular planar form and the sectional structure previously shown in FIG. 1 at the individual intersections between orthogonally arranged first wirings (e.g., bit lines) 11 and second wirings (e.g., word lines) 12 individually provided large in number so as to form a matrix pattern. As previously shown in FIG. 1, each magnetic storage element 10 is configured so as to have the magnetization-fixed layer 3 disposed below the storage layer 1 while placing the tunnel insulating layer 2 in between, and so as to have the magnetic field shield 5 which comprises a soft magnetic material disposed between the storage layer 1 and the first wiring 11. The first wirings 11 are aligned in parallel with the direction of the hard axis of magnetization (Y direction) of the magnetic storage element 10, and the second wirings 12 are aligned in parallel with the direction of the easy axis of magnetization (X direction) of the magnetic storage element 10.

To one end of the first wiring 11, a driver transistor 21 for electrifying the first wiring 11 is connected. To one end of the second wiring 12, a driver transistor 22 for electrifying the second wiring 12 is connected. To the pinned layer 3, an element selection transistor 23 for detecting magnetization status of the storage layer 1 is connected.

In thus-configured magnetic storage device, recording to the magnetic storage element 10 is proceeded as described below.

One each of the first wiring 11 and the second wiring 12 are selected out of those individually provided in a large plurality of number, and the first wiring 11 is electrified in a direction corresponding to information to be recorded (0 or 1) in the magnetic storage element 10 located at the intersection of thus selected first wiring 11 and second wiring 12. When the second wiring 12 is electrified, the magnetic field shield 5 heats up to thereby decrease or lose the magnetization thereof due to temperature rise, and lowers or lose the shielding ability. This allows the storage layer 1 to be applied with a sufficient intensity of the current-induced magnetic field from the first wiring, and to be recorded with information. Any change in the selection of the first wiring 11 and the second wiring 12 results in information recording into other arbitrary magnetic storage elements.

In the above-described recording, the selected magnetic storage element 10, that is, the magnetic storage element 10 having both of the first wiring 11 and the second wiring 12 as being electrified, enables recording of a magnetization state into the storage layer 1, because the magnetic field shield 5 heats up by the current supplied through the second wiring 12 and reduces or loses its shielding ability, and this allows the storage layer 1 to be applied with a sufficient intensity of the current-induced magnetic field ascribable to electric current supplied through the first wiring 11.

On the contrary, in the magnetic storage element 10 having only the first wiring 11 as being electrified, the magnetization state of the storage layer 1 does not change because a part of or entire portion of the current-induced magnetic field ascribable to the current supplied through the first wiring 11 is shielded by the magnetic field shield 5, and this reduces the current-induced magnetic field to be applied to the storage layer 1, and leaves the magnetization state of the storage layer 1 un-inverted. In the magnetic storage element 10 having only the second wiring 12 as being electrified, the magnetization state of the storage layer 1 again does not change, even though the shielding ability of the magnetic field shield 5 is reduced or lost under heating, because the current-induced magnetic field cannot be produced from the first wiring 11, and so that the storage layer 1 is not applied with the current-induced magnetic field, and does not change the magnetization state thereof. This successfully prevents any unselected magnetic storage elements 10 from being erroneously recorded.

As a consequence, in each of the magnetic storage elements 10, magnetization information is recorded into the storage layer 1 only when both of the corresponding first wiring 11 and second wiring 12 are selected at the same time. This means that any unintended magnetic storage elements 10 are prevented from being erroneously recorded.

Assuming now that a large number of the magnetic storage elements 10 in the magnetic storage device 20 are to be recorded, it is allowable to sequentially produce the current-induced magnetic field for each of the first wiring (e.g., bit line) 11 for a selected second wiring (e.g., word line) 12, to thereby enable sequential recording into magnetic storage elements 10 which reside in the same line corresponded to thus-selected singular second wiring 12, or it is also allowable to produce the current-induced magnetic field to a plurality of first wirings (e.g., bit lines) 11 at the same time, to thereby enable simultaneous recording into a plurality of magnetic storage elements which reside in the same line.

According to the above-described configuration of the magnetic storage device 20 of the present embodiment, any unintended magnetic storage elements 10 are successfully prevented from being erroneously recorded, and the individual magnetic storage elements 10 can be recorded in a stable and correct manner even if the coercive force of the storage layer 1 thereof vary from element to element. The magnetic storage device 20 of the present embodiment is still also advantageous in increasing the storage capacity, because general efforts of downsizing the magnetic storage elements intended for an increased storage capacity tend to undesirably increase the coercive force of the storage layers of the individual magnetic storage elements, and also tend to increase variations in the magnetic characteristics.

Because the device can enhance the magnetic field applied to the storage layer 1 of the selected magnetic storage element 10 by heating the magnetic field shield 5 to thereby weaken or lose the shielding ability thereof, it is no more necessary to considerably enhance the current-induced magnetic field from the first wiring 11 as compared with that of the conventional MRAM, and this enables recording by supplying only a practical amount of electric current through the first wiring 11.

Figure 4A:
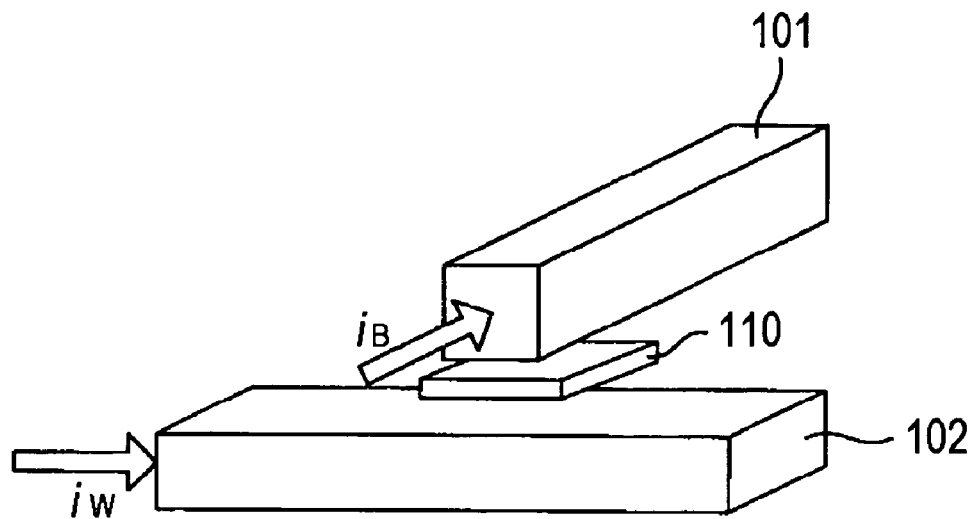
FIGS. 4A and 4B are perspective views showing a magnetic storage element used for a conventional MRAM and the magnetic storage element shown in FIG. 1, respectively.

Comparison was made between constitutions of a magnetic storage element used for the conventional MRAM and of the magnetic storage element of the present invention shown in FIG. 1. The comparative constitution is such as shown in FIG. 4A, in which the magnetic storage medium used for the conventional MRAM is configured so as to enable information recording into a storage layer 110 composed of a ferromagnetic material, making use of an orthogonal magnetic field generated by a current $i_B$ and a current $i_W$ supplied through two orthogonal conductive wirings 101 and 102. On the other hand, the magnetic storage element 10 shown in FIG. 1 is configured so as to allow the current $i_B$ to flow through the first wiring 11, and the current $i_W$ to flow through the second wiring 12 as shown in FIG. 4B.

Figure 4B:
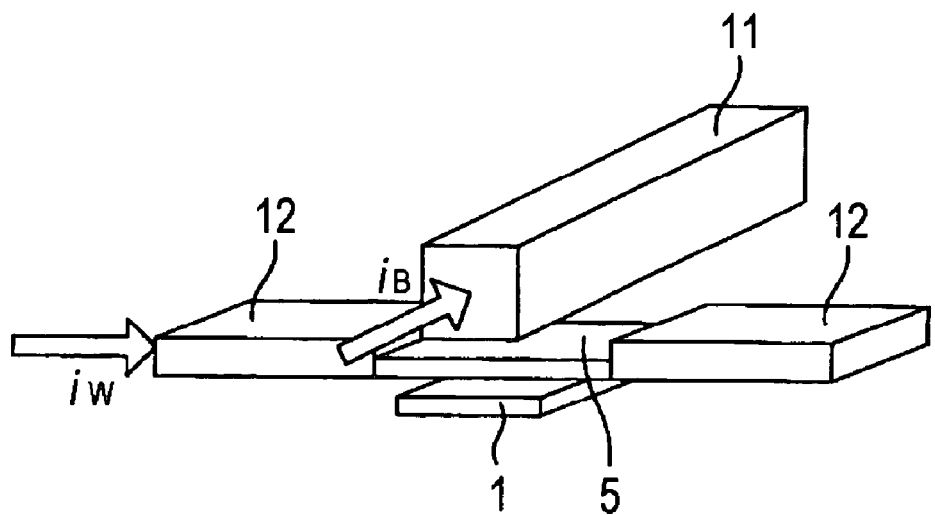

First, an oval NiFi alloy film having a long axis of 1 $\mu$m, a short axis of 0.5 $\mu$m and a thickness of 6 nm was used respectively for the storage layer 110 in FIG. 4A and the storage layer 1 in FIG. 4B so as to align the long axis thereof in parallel with the direction of the second wirings (word lines) 102, 12, to thereby configure the magnetic storage elements. The magnetic field shield 5 in FIG. 4B used herein was a stack obtained by staking two NiFeMn alloy films of 1.5-$\mu$m square and 15 nm thick while placing an $SiO_2$ film of 2 nm thick in between. With respect to each of the storage layers 110, 1, a pinned layer was disposed while placing a tunnel insulating film in between, although not shown. An aluminum oxide film was used for the tunnel insulating film for the both. As the pinned layers, a ferromagnetic layer comprising a CoFr alloy layer of 3 nm thick and an antiferromagnetic layer comprising a PtMn alloy film of 30 nm thick were used respectively.

Magnetization inversion of these magnetic storage elements of the comparative example and of the present invention were measured by preliminarily magnetizing the storage layers 110, 1 in a unidirectional manner, and then supplying the currents $i_B$ and $i_W$ through the first wirings (bit lines) 101, 11 and the second wirings (word lines) 102, 12 in the direction causative of magnetization inversion. The measurement was made on a plurality of magnetic storage elements to thereby investigate relation between the amount of the current $i_B$ supplied through the first wirings 101, 11 and probability of magnetization inversion. Direction of magnetization of the storage layers 110, 1 was measured by detecting a tunnel current flowing between the storage layers 110, 1 and the pinned layers.

Figure 5A:
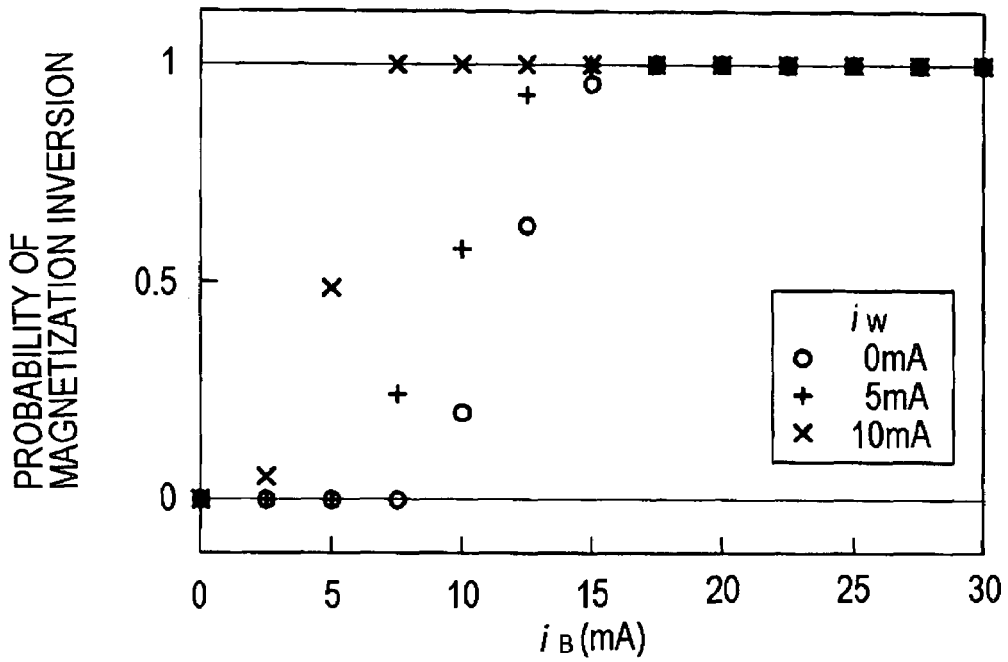
FIGS. 5A and 5B are graphs showing changes in probability of magnetization inversion of the magnetic storage elements shown in FIGS. 4A and 4B, respectively, depending on changes in word line current and bit line current.
Figure 5B:
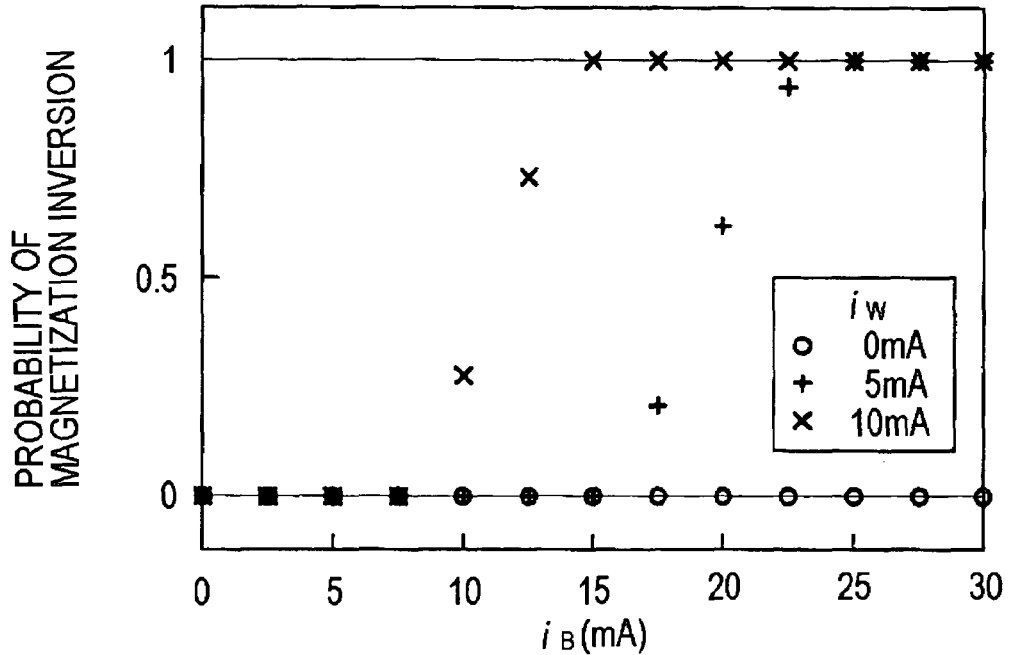

FIG. 5A shows probability of magnetization inversion of the magnetic storage layer 110 in the comparative magnetic storage element shown in FIG. 4A, obtained under varied amounts of the current $i_B$ in the bit line, and the current $i_W$ in the word line. FIG. 5B shows probability of magnetization inversion of the magnetic storage layer 1 in the magnetic storage element of the present invention shown in FIG. 4B, obtained under varied amounts of the current $i_B$ in the bit line and the current $i_W$ in the word line.

To ensure recording only to the selected magnetic storage element without error, probability of magnetization inversion must be "1" when the word line and the bit line are electrified at the same time, and must be "0" for any other cases. It is thus clear from FIG. 5A that correct recording of the comparative magnetic storage element shown in FIG. 4A without errors can be ensured only by a bit line current $i_B$ ranging from 7.5 mA to 10 mA. In contrast to this, it is clear from FIG. 5B that the magnetic storage element of the present invention shown FIGS. 1 and 4B can operate without errors by a bit line current $i_B$ ranging from 25 mA to 30 mA under a word line current $i_W$ of 5 mA, and by a bit line current $i_B$ ranging as wide as from 15 mA to 30 mA under a word line current $i_W$ of as large as 10 mA. It is thus known that the magnetic storage element of the present invention successfully enlarged an operable range which allows recording without errors.

Figure 6:
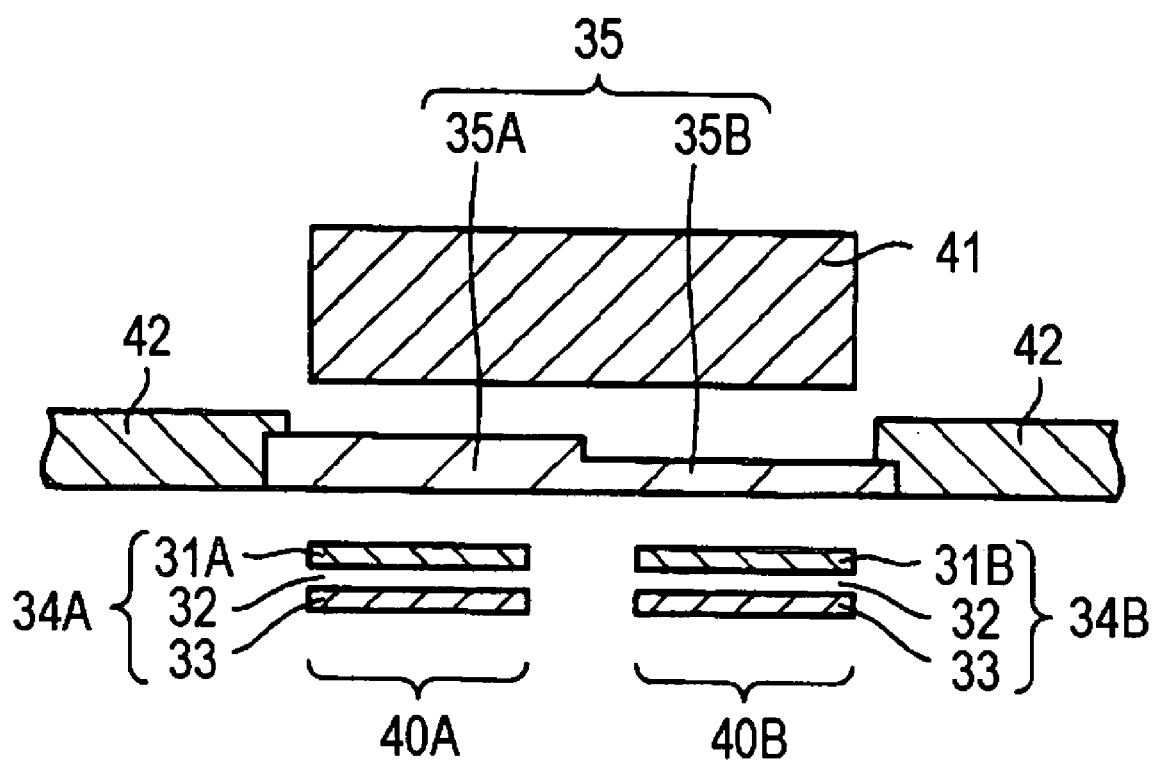
FIG. 6 is a schematic drawing (sectional view) showing a configuration of a magnetic storage element according to another embodiment of the present invention.

Next, a schematic drawing (sectional view) of a configuration of a magnetic storage element according to another embodiment of the present invention is shown in FIG. 6. In the present embodiment shown in FIG. 6, two magnetic storage elements 40A and 40B are disposed at an intersection of a first wiring 41 and a second wiring 42, and these magnetic storage elements 40A, 40B have storage layers 31A, 31B and tunnel insulating layers 32, 32 and pinned layers 33, 33, respectively.

As another feature, a magnetic field shield 35 of the present embodiment is divided in different portions by areas. More specifically, a portion 35A above the magnetic storage element 40A on the left is formed in a large thickness, and a portion 35B above the magnetic storage element 40B on the right is formed in a small thickness. A variety of soft magnetic materials descried in the above are available as a material for composing the magnetic field shield 35. In thus-configured magnetic field shield 35, a current supplied through the second wiring (e.g., word line) 42 flows also through the thick portion 35A and the thin portion 35B in a serial manner, where a temperature of the magnetic field shield 35 becomes higher in the thin portion 35B and lower in the thick portion 35A, because the thin portion 35B has a larger resistivity and thus produces a larger amount of heat.

Next paragraphs will describe changes in lines of magnetic force of the current-induced magnetic field from the first wiring 41 of the magnetic storage element of the present embodiment depending on the temperature of the magnetic field shield 35, referring to FIG. 7.

Figure 7A:
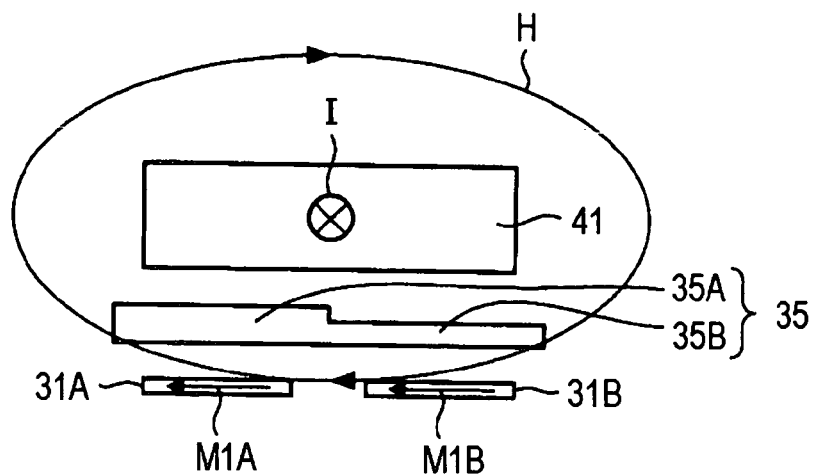
FIGS. 7A to 7C are drawings showing changes in a line of magnetic force of a current-induced magnetic field in the configuration shown in FIG. 6 depending on temperature of a magnetic field shield.

When the second wiring 42 is electrified so as to raise temperatures of the all portions 35A and 35B of the magnetic field shield 35 to the Curie temperature or above, the entire portion of the magnetic field shield 35 loses the shielding ability, this allows a sufficient intensity of the current-induced magnetic field from the first wiring 11 to affect the storage layers 31A and 31B of both magnetic storage elements to thereby invert the magnetization of the storage layers 31A and 31B so as to align them in the same direction, and this results in recording of the same magnetization information, as shown in FIG. 7A. Since the current I in the exemplary case shown in FIG. 7A is supplied through the first wiring 41 in the going-off direction perpendicular to the sheet of drawing, the current-induced magnetic field H is generated in a clock-wise direction, and affects leftwards both storage layers 31A and 31B, and aligns magnetizations M1A and M1B of the storage layers 31A and 31B leftwards.

Figure 7B:
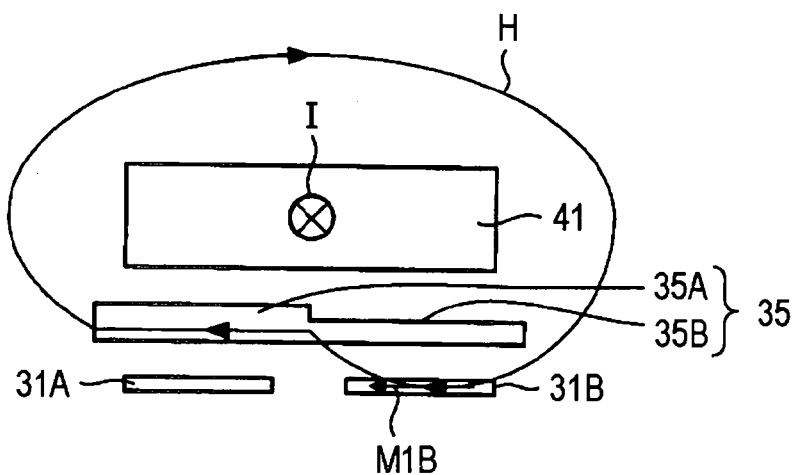

If the current to be supplied to the second wiring 42 is reduced so as to keep only the thin portion 35B of the magnetic field shield 35 at a temperature not lower than the Curie temperature, recording is made only to the storage layer 31B of the magnetic storage element on the right located below the thin portion 35B of the magnetic field shield 35, as shown in FIG. 7B. Since the current I in the exemplary case shown in FIG. 7B is supplied through the first wiring 41 in the same direction as shown in FIG. 7A, the current-induced magnetic field H is generated in the clock-wise direction, and affects leftwards the storage layer 31B of the magnetic storage element on the right, and aligns the magnetization M1B of the storage layer 31B leftwards. On the other hand, neither change in the magnetization nor recording take place for the storage layer 31A of the magnetic storage element on the left, because the current-induced magnetic field H is concentrated to the thick portion 35A of the magnetic field shield 35 and is not applied to the storage layer 31A, which keeps the storage layer 31A unchanged in magnetization and unrecorded.

Figure 7C:
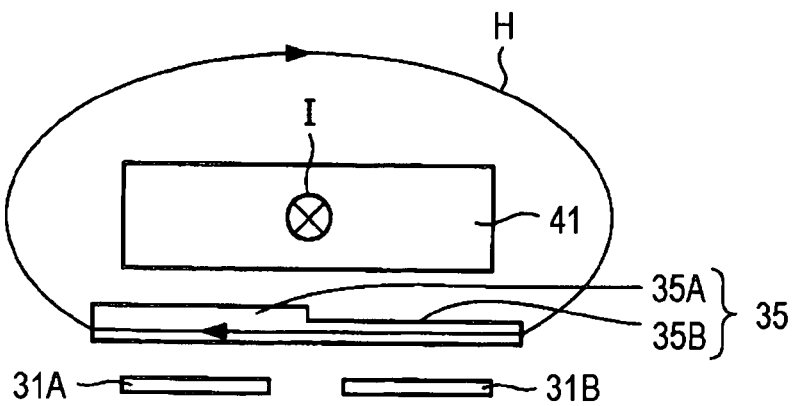

In a further exemplary case where the second wiring 42 is not electrified, the entire portions 35A, 35B of the magnetic field shield 35 functions as a shielding body as shown in FIG. 7C to thereby concentrate the current-induced magnetic field H from the first wiring 41 into the magnetic field shield 35, so that both magnetic storage elements 31A and 31B are not applied with a sufficient intensity of the current-induced magnetic field H, and are remained unchanged in the magnetization. As a consequence, neither storage layer 31A nor 31B of both magnetic storage elements are recorded.

Making use of such changes in the status, two magnetic storage elements 40A and 40B can selectively be recorded with arbitrary information. When information to be recorded into the two magnetic storage elements 40A and 40B are the same ("0" or "1" for the both), the first wiring 41 is supplied with the electric current I similarly to as shown in FIG. 7A, and the second wiring 42 is electrified to thereby heat the entire portions 35A and 35B of the magnetic field shield 35 to as high as the Curie temperature or above, so as to allow both the storage layers 31A and 31B of the two magnetic storage elements 40A and 40B to sufficiently be applied with the current-induced magnetic field H from the first wiring 41. This results in recording of the magnetization M1A and M1B having the same direction both into the storage layers 31A and 31B of the two magnetic storage elements 40A and 40B. These magnetizations M1A and M1B can be inverted into right-handed ones contrary to as shown in FIG. 7A if the direction of electrification of the first wiring 41 is changed into the coming-out direction.

On the other hand, when information to be recorded into the two magnetic storage elements 40A and 40B are different from each other ("0" and "1", or "1" and "0"), the recording will be carried out in two steps.

Figure 8A:
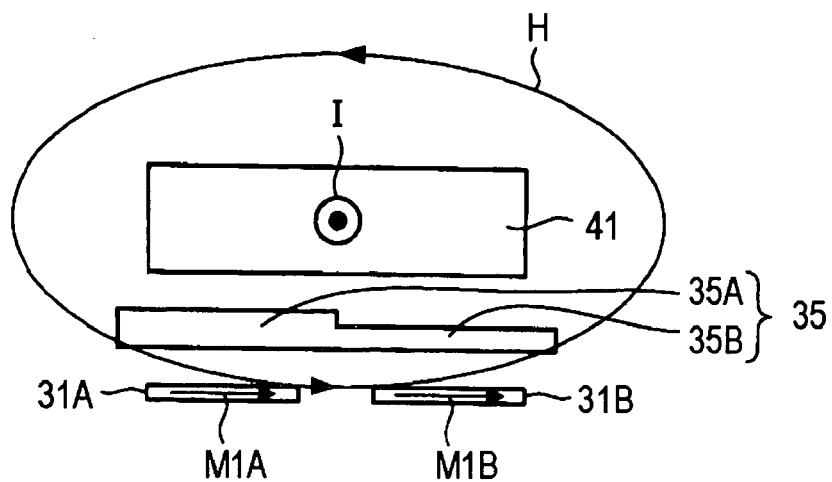
FIGS. 8A and 8B are drawings for explaining methods of recording different information into two of the magnetic storage elements shown in FIG. 6.

In the first step, as typically shown in FIG. 8A, the first wiring 41 is supplied with the electric current I, and the second wiring 42 is electrified to thereby heat the entire portions 35A and 35B of the magnetic field shield 35 to as high as the Curie temperature or above, so as to allow both the storage layers 31A and 31B of the two magnetic storage elements 40A and 40B to sufficiently be applied with the current-induced magnetic field H from the first wiring 41. This results in recording of the magnetization M1A and M1B having the same direction both into the storage layers 31A and 31B of the two magnetic storage elements 40A and 40B. Since the current I in the exemplary case shown in FIG. 8A is supplied through the first wiring 41 in the coming-out direction, the current-induced magnetic field H is generated in the counter-clock-wise direction, and affects rightwards the storage layers 31A, 31B, and aligns the magnetizations M1B, M1B of the storage layers 31A, 31B rightwards.

Figure 8B:
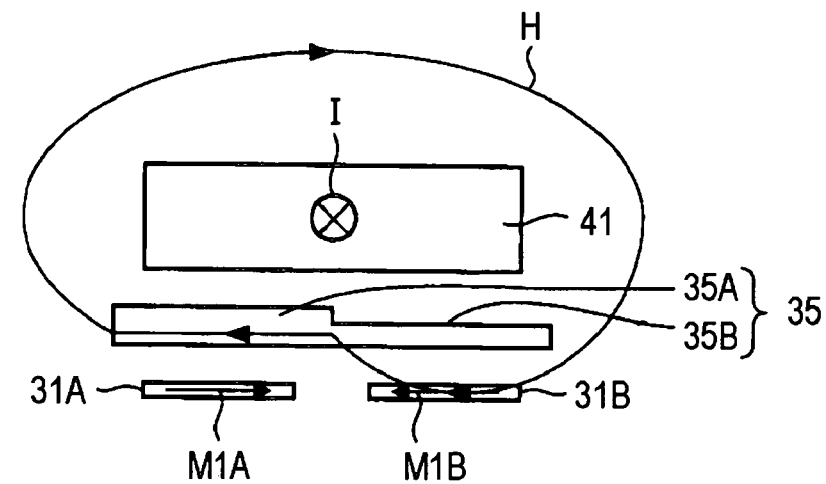

In the second step, the direction of the current I supplied to the first wiring 41 is inverted from that in the first step, and the current to be supplied to the second wiring 42 is reduced so as to keep only the thin portion 35B of the magnetic field shield 35 at a temperature not lower than the Curie temperature, so as to allow only the storage layer 31B of the magnetic storage element on the right located below the thin portion 35B of the magnetic field shield 35 to be applied with a sufficient intensity of the current-induced magnetic field H from the first wiring 41 as shown in FIG. 8B. Since the current I supplied through the first wiring 41 is inverted, also the resultant current-induced magnetic field H is inverted, and this inverts the direction of the magnetization M1B of the storage layer 31B of the magnetic storage element on the right from that in the first step. Because the current I supplied through the first wiring 41 in FIG. 8B is in the going-off direction, the current-induced magnetic field H is generated in the clock-wise direction, affects leftwards the storage layer 31B, and inverts the magnetization M1B of the storage layer 31B from right-handed to left-handed. The storage layer 31A of the magnetic storage element on the left herein is not fully applied with the current-induced magnetic field H from the first wiring 41, causes no changes in the magnetization M1A thereof, and keeps the same direction of magnetization with that in the first step (right-handed in FIG. 8B).

The magnetization M1A of the storage layer 31A of the magnetic storage element on the left can be inverted into left-handed one, and the magnetization M1B of the storage layer 31B of the magnetic storage element on the right can be inverted into right-handed one contrary to as shown in FIG. 8B, if the directions of the current I supplied through the first wiring 41 in the first step and second step are individually inverted from those shown in FIGS. 8A and 8B.

Figure 9:
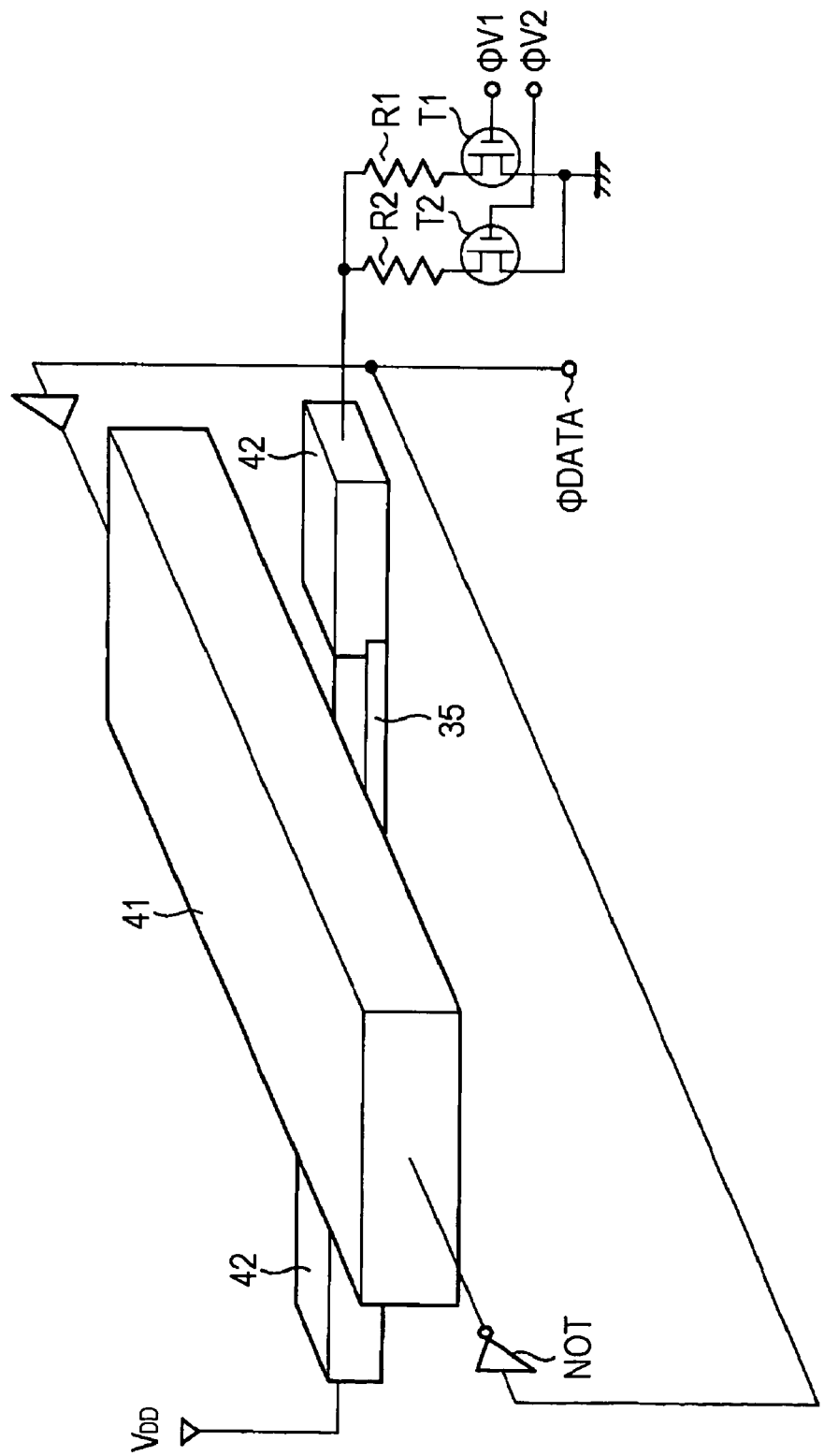
FIG. 9 is a drawing of an exemplary embodiment of a circuit configuration which enables recording operation shown in FIG. 8 based on the configuration shown in FIG. 6.

One possible circuit configuration for enabling the above-described recording operation of the magnetic storage element of the present embodiment is shown in FIG. 9. In the configuration shown in FIG. 9, a NOT circuit NOT is connected to one end of the first wiring 41 so that + or − voltage φDATA is supplied to both ends of the first wiring 41 corresponding to information to be recorded. On the other hand, a source voltage $V_{DD}$ is supplied to one end of the second wiring 42, and a circuit for varying the amount of current to be supplied to the second wiring 42 is connected to the other end. The circuit comprises a first route in which a first selection transistor T1 and a first resistor R1 are connected in series, and a second route in which a second selection transistor T2 and a second resistor R2 are connected in series, where these routes are connected in parallel, and is grounded at one end. The gate of the first selection transistor T1 is supplied with a first selection voltage φV1, and the gate of the second selection transistor T2 is supplied with a second selection voltage φV2.

Assuming now that resistivity values of the first resistor R1 and second resistor R2 satisfies a relation of R1<R2, supply of the first selection voltage φV1 to turn on the first selection transistor T1 allows a large amount of current to flow in the second wiring 42 since the first resistor R1 has only a small resistivity value, and this raises the temperature of the entire portions 35A, 35B of the magnetic field shield 35 to thereby effect recording into two magnetic storage elements 40A, 40B. On the other hand, supply of the second selection voltage φV2 to turn on the second selection transistor T2 allows a small amount of current to flow in the second wiring 42 since the second resistor R2 has a large resistivity value, and this raises temperature only of the thin portion 35B of the magnetic field shield 35 to thereby effect recording only to the magnetic storage element 40B on the right.

According to the present embodiment characterized in having the magnetic field shield 35 composed of a soft magnetic material between the storage layers 31A, 31B of the magnetic storage elements 40A, 40B and the first wiring 41, a part of or the entire portion of the current-induced magnetic field from the first wiring 41 is shielded by the magnetic field shield 35 at around the room temperature, so that the storage layer 31 does not cause magnetization inversion and remained unrecorded. On the other hand, when the electric current is supplied to the second wiring 42 so as to electrify the magnetic field shield 35 to heat it, the heated magnetic field shield 35 reduces or loses its shielding ability, so that the storage layers 31A, 31B will have a sufficiently larger current-induced magnetic field applied thereto, and will allow information to be recorded therein. Therefore similarly to the above-described magnetic storage element 10, supplying a sufficient amount of current to the first wiring 41 and the second wiring 42 at the same time activates the aforementioned recording operation, but electrification only of the first wiring 41, or only of the second wiring 42 does not activate recording to the storage layers 31A, 31B.

If the current to be supplied to the second wiring 42 is reduced so as to keep only the thin portion 35B of the magnetic field shield 35 at a temperature not lower than the magnetic transition temperature, a sufficient intensity of the current-induced magnetic field is applied only to the storage layer 31B of the magnetic storage element 40B located below the thin portion 35B of the magnetic field shield 35, and recording is made only to the storage layer 31B, while the storage layer 31A of the other magnetic storage element 40A remains unrecorded. This allows only one magnetic storage element 40B to selectively be recorded. In addition, combination with the aforementioned recording operation for effecting recording to both magnetic storage elements 40A and 40B as shown in FIGS. 8A and 8B enables recording of arbitrary information to the two magnetic storage elements 40A and 40B.

Assuming now that the magnetic storage device is composed of a plural sets of the two magnetic storage elements 40A, 40B as shown in FIG. 6, proper selection of the amount of current to be supplied through the first wiring 41 and the second wiring 42 allows correct selection of the magnetic storage elements to be recorded and those remained unrecorded, even if some variations reside in the coercive force of the storage layers 31A, 31B of the magnetic storage elements 40A, 40B. It is thus made possible to configure a magnetic storage device capable of ensuring stable and correct information recording by using the magnetic storage elements of the present embodiment.

By using the aforementioned magnetic storage elements 40A, 40B shown in FIG. 6, it is also possible to configure a magnetic storage device similarly to the magnetic-storage device 20 shown in FIG. 3. According to the magnetic storage device configured using the magnetic storage elements 40A, 40B shown in FIG. 6, selection of the first wiring 41 and the second wiring 42 to be electrified, and selection of the amount of current to be supplied through the second wiring 42 so as to designate a condition of the magnetic field shield 35 can successfully prevents the other magnetic storage elements from being erroneously recorded, and ensures stable and correct recording without erroneous writing even if some variation reside in the coercive force of the storage layers 31A, 31B of the magnetic storage elements 40A, 40B.

Figure 10:
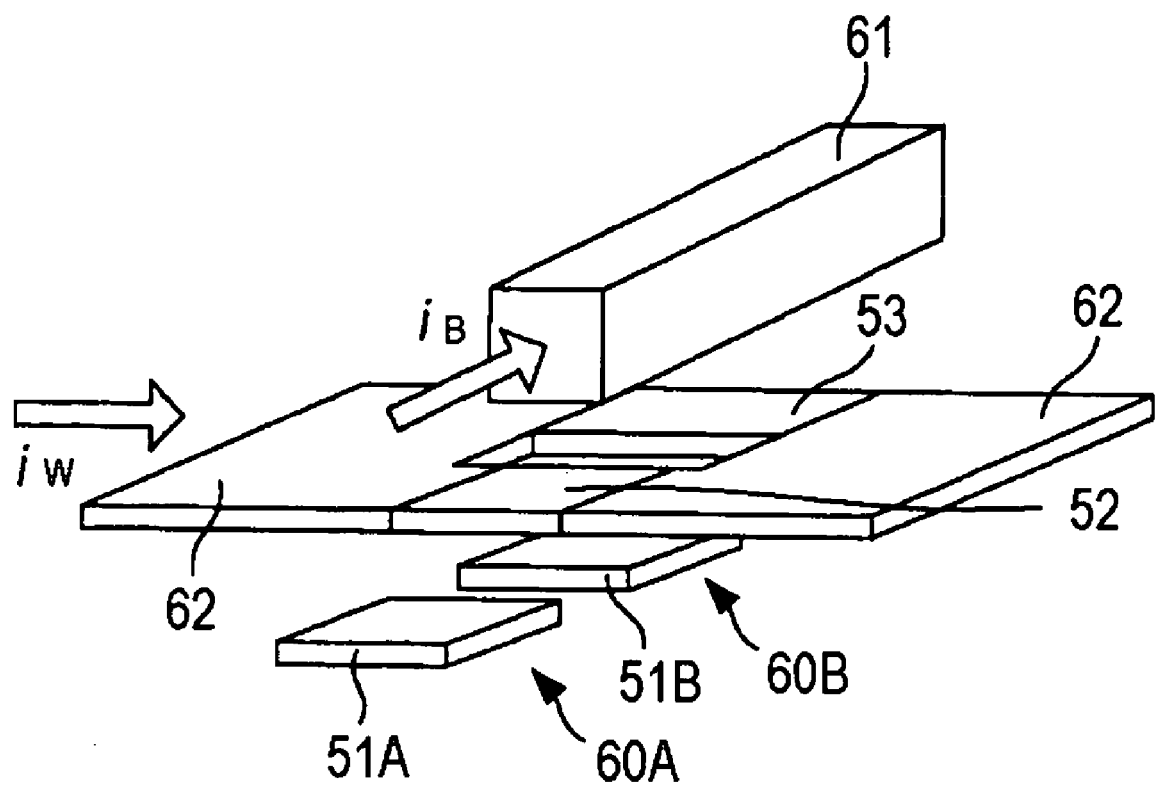
FIG. 10 is a schematic drawing (perspective view) showing a configuration of a magnetic storage element according to still another embodiment of the present invention.

Next, a schematic drawing (perspective view) of a configuration of a magnetic storage element according to still another embodiment of the present invention is shown in FIG. 10. In this embodiment, two magnetic storage elements 60A and 60B are disposed in parallel with a first wiring (bit line) 61 and in a direction perpendicular to a second wiring (word line) 62. A short magnetic field shield 52 is disposed above a storage layer 51A of the first magnetic storage element 60A disposed on a front side in the drawing, and a long magnetic field shield 53 is disposed above a storage layer 51B of the second magnetic storage element 60B disposed on a back side in the drawing. These two magnetic field shields 52 and 53 are connected to the same second wiring 62 while keeping a parallel relation therebetween. These two magnetic field shields 52 and 53 are configured so as to be same in the width but different in the length. These two magnetic field shields 52 and 53 can typically be composed of various soft magnetic materials described in the above.

In this configuration, the short magnetic field shield 52 has a lower resistivity value, and the long magnetic field shield 53 has a higher resistivity value. In the embodiment previously shown in FIG. 6, a larger heat generation was obtained from the thin portion 35B having a higher resistivity value, because the two portions 35A, 35B of the magnetic field shield 35 were connected in series. In contrast to this, the two magnetic field shields 52 and 53 in the present embodiment are connected to the second wiring 62 while keeping a parallel relation therebetween, the magnetic field shields 52 and 53 will have the same voltage applied on both sides thereof. Larger current can flow in the route having smaller resistivity value to thereby generate a lager amount of heat, so that the short magnetic field shield 52 herein is causative of a larger amount of heat generation, and is more likely to reduce the magnetization as compared with the long magnetic field shield 53. It is therefore possible to effect recording only to the storage layer 51A of the magnetic storage element 61A located below the magnetic field shield 52 by adjusting the amount of current to be supplied through the second wiring 62.

Now for the magnetic storage elements 60A, 60B, probability of magnetization inversion of the storage layers 51A, 51B depending on changes in a current $i_B$ of the bit line and in a current $i_W$ of the word line were measured similarly to the measurement previously shown in FIG. 5. The short magnetic field shield 52 was defined as being 1.5 μm long and 1 μm wide, and the long magnetic field shield 53 was defined as being 2 μm long and 1 μm wide. The storage layers 51A, 51B, the tunnel insulating layer and the magnetization-fixed layer were configured similarly to as shown in FIG. 4B.

Figure 11A:
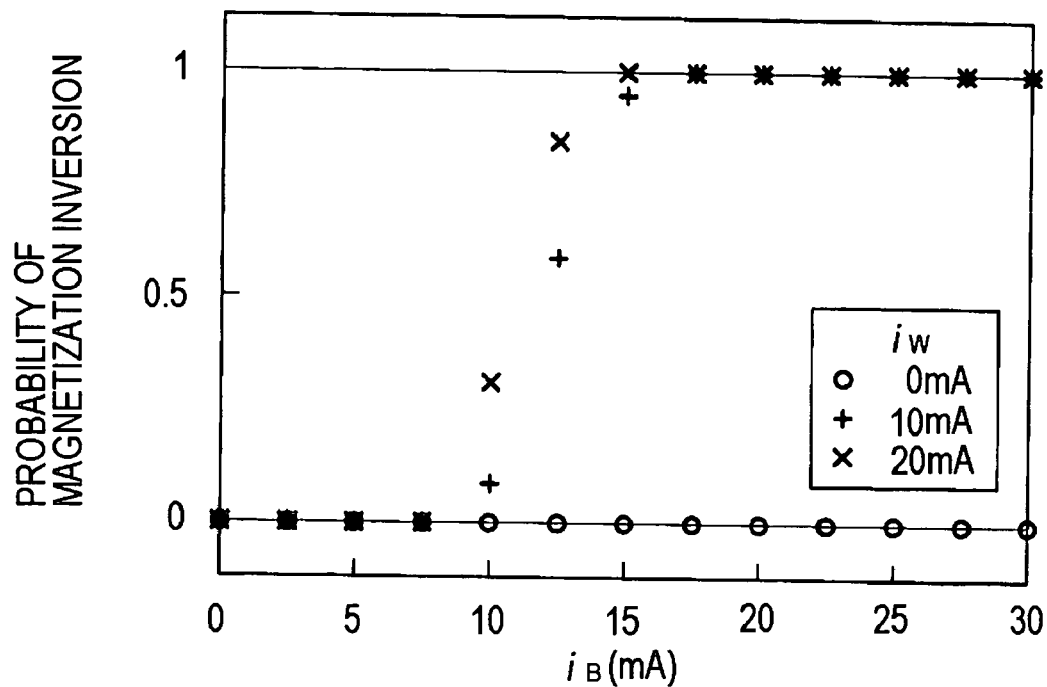
FIGS. 11A and 11B are graphs showing changes in probability of magnetization inversion of the magnetic storage element shown in FIG. 10 depending on changes in word line current and bit line current.
Figure 11B:
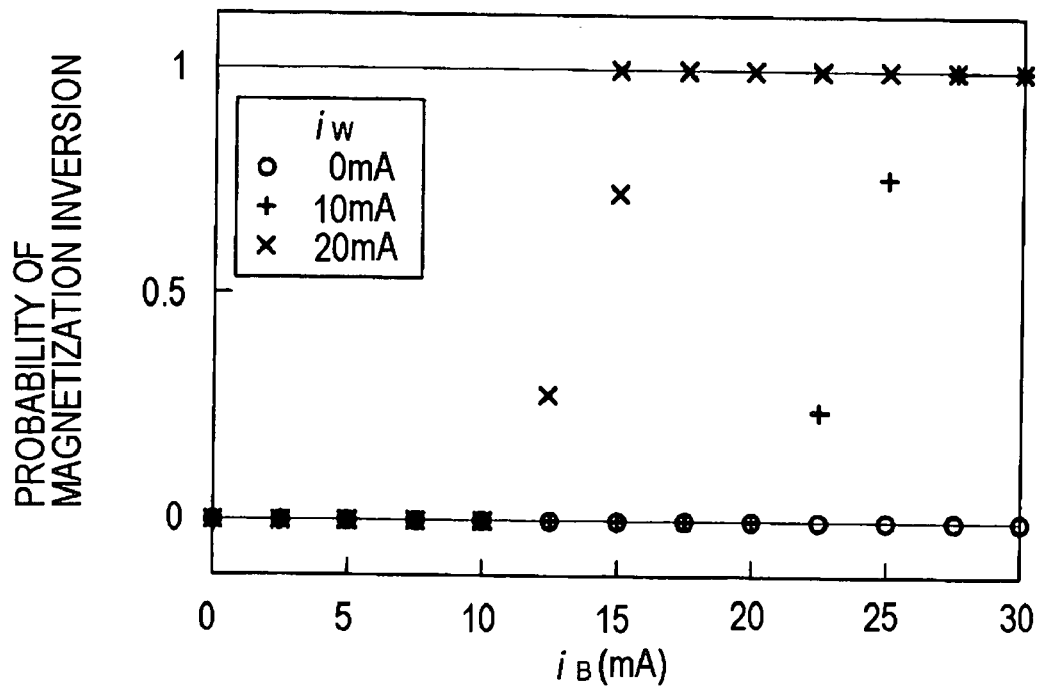

FIG. 11A shows results of the measurement for the first magnetic storage element 60A located below the short magnetic field shield 52, and FIG. 11B shows results of the measurement for the second magnetic storage element 60B located below the long magnetic field shield 53. It is clear from FIG. 11A that the bit line current $i_B$ required for causing magnetization inversion of the storage layer 51A of the first magnetic storage element 60A does not largely differ if the word line current $i_W$ varies from 10 mA to 20 mA. On the other hand, it is clear from FIG. 11B that the bit line current $i_B$ required for causing magnetization inversion of the storage layer 51B of the second magnetic storage element 60B largely differs when the word line current $i_W$ varies from 10 mA to 20 mA.

It is therefore possible to magnetize the storage layer 51A of the first magnetic storage element and the storage layer 51B of the second storage element in the same direction by first supplying the word line with the current $i_W$ of 20 mA and then supplying the bit line with the current $i_B$ of 17.5 mA or above. Recording thereafter with the bit line current $i_B$ of 17.5 mA to 20 mA under the lowered word line current $i_W$ to as low as 10 mA results in recording only to the storage layer 51A of the first magnetic storage element. It is now obvious that the first magnetic storage element 60A and the second magnetic storage element 60B can arbitrarily be recorded.

The magnetic storage device of the present embodiment, characterized in having the magnetic field shields 52, 53 composed of a soft magnetic material between the storage layers 51A, 51B of the magnetic storage elements 60A, 60B and the first wiring 61, can operate similarly to the magnetic storage element 10 of the previous embodiment shown in FIG. 1, in which supply of a sufficient amount of current to the first wiring 61 and the second wiring 62 at the same time activates the aforementioned recording operation, but electrification only of the first wiring 61, or only of the second wiring 62 does not activate recording to the storage layers 51A, 51B.

If the current to be supplied to the second wiring 62 is reduced so as to keep only the short magnetic field shield 52 at a temperature not lower than a magnetic field transition temperature, a sufficient intensity of the current-induced magnetic field from the first wiring 61 is applied only to the storage layer 51A of the magnetic storage element 60A located below the short magnetic field shield 52, and recording is made only to the storage layer 51A, while the storage layer 51B of the other magnetic storage element 60B remains unrecorded. This allows only one magnetic storage element 60A to selectively be recorded. In addition, combination with the aforementioned recording operation for effecting recording to both magnetic storage elements 60A and 60B as shown in FIGS. 8A and 8B enables recording of arbitrary information to two magnetic storage elements 60A and 60B.

Assuming now that the magnetic storage device is composed of a plural sets of the two magnetic storage elements 60A, 60B as shown in FIG. 10, proper selection of the amount of current to be supplied through the first wiring 61 and the second wiring 62 allows correct selection of the magnetic storage elements to be recorded and those remained unrecorded, even if some variations reside in the coercive force of the storage layers 51A, 51B of the magnetic storage elements 60A, 60B. It is thus made possible to configure a magnetic storage device capable of ensuring stable and correct information recording by using the magnetic storage elements of the present embodiment.

It is to be noted that similar operation can be obtained also by adopting a configuration in which two magnetic field shields differ in the width, rather than in the length. In this case, the narrower magnetic field shield has a higher resistivity value, and thus generates a larger amount of heat.

By using the aforementioned magnetic storage elements 60A, 60B shown in FIG. 10, it is also possible to configure a magnetic storage device similarly to the magnetic storage device 20 shown in FIG. 3. According to the magnetic storage device configured using the magnetic storage elements 60A, 60B shown in FIG. 10, selection of the first wiring 61 and the second wiring 62 to be electrified, and selection of the amount of current to be supplied through the second wiring 62 so as to designate a condition of the magnetic field shields 52, 53 can successfully prevents the other magnetic storage elements from being erroneously recorded, and ensures stable and correct recording without erroneous writing even if some variation reside in the coercive force of the storage layers 51A, 51B of the magnetic storage elements 60A, 60B.

While the embodiments shown in FIGS. 6 and 10 dealt with the configuration in which two magnetic field shields are differed in the dimensions such as thickness and length, still other configurations are allowable for these two magnetic field shields. Specific embodiments thereof will be described below.

Figure 12:
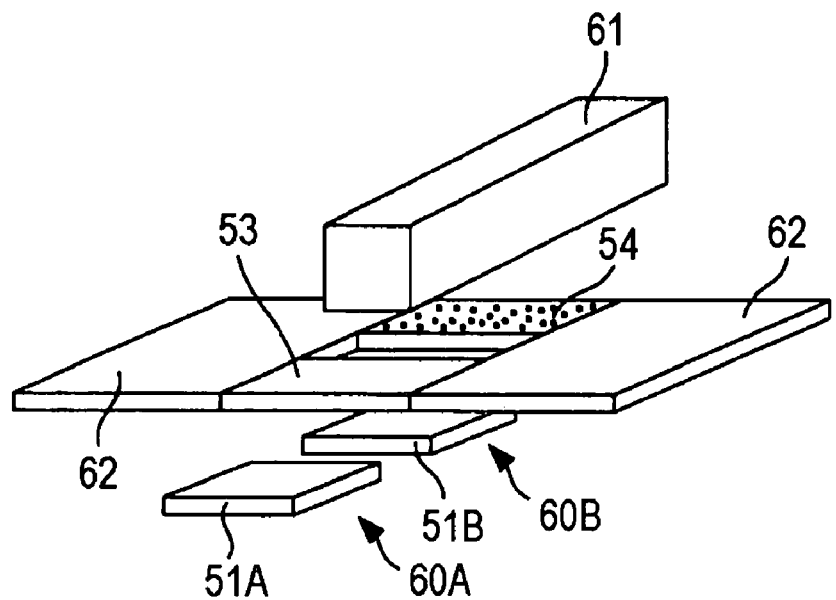
FIG. 12 is a perspective view showing an embodiment in which two magnetic field shields differing in the materials composing thereof are connected in parallel.

An embodiment shown in FIG. 12 relates to a case in which two magnetic field shields 53 and 54 are composed of different materials. Possible configurations based on different soft magnetic materials include a configuration using a plurality of soft magnetic materials differing in elements to be contained, and a configuration using alloyed soft magnetic materials differing in compositional ratio of elements composing thereof.

In the present embodiment, difference in the soft magnetic materials results in different temperature characteristics of these soft magnetic materials, and this typically ensures reduction in the magnetization at a lower temperature, or reduction in the magnetization at a larger reduction ratio. This makes it possible to effect recording to only one storage layer of the magnetic storage element located below either one of the magnetic field shields 53 and 54 composed of either one of the materials. For a case where difference in the soft magnetic materials causes a large difference in resistivity therebetween, such difference in resistivity is causative of difference in the amount of heat generation, similarly to the case where dimensions of the magnetic field shields are varied. This also makes it possible to effect recording only to the storage layer of the magnetic storage element located below either one of the magnetic field shields.

Figure 13:
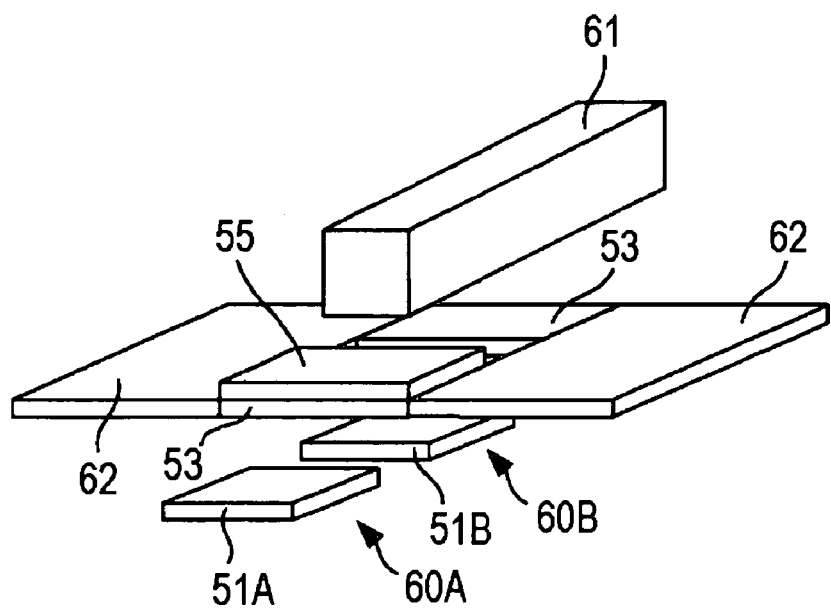
FIG. 13 is a perspective view showing an embodiment in which one of two magnetic field shields is provided with other component.

An embodiment shown in FIG. 13 relates to a case in which two magnetic field shields 53 and 53 identical in the material and dimension are connected to the second wiring 62 while keeping a parallel relation therebetween, and one of two magnetic field shields 53 and 53, which is shown on a front side in FIG. 13, is further provided with other component (film or element) 55. Possible examples of other component 55 include those such as a conductive film, capable of varying electric characteristics so as to vary amount of current supplied through the magnetic field shield 53; a heat sink or cooling measures (those having functions equivalent to those of Peltier element); and those such as heating means (heat-generating resistor, etc.), capable of varying temperature characteristics so as to vary temperature of the magnetic field shield 53. For a case where the other component 55 is composed of a conductive film, the conductive film will have a large current flowing therein and raise the amount of heat generation, and this makes it possible to effect recording only to the magnetic storage element 60A located on the side provided with the conductive film as the other component 55, by properly adjusting amount of current to be supplied through the second wiring 62. For a case where the other component 55 is composed of a heat sink or cooling means, the magnetic field shield 53 will have a lowered magnetization due to cooling, and this makes it possible to effect recording only to the magnetic storage element 60B located on the side not provided with the other component 55, by properly adjusting amount of current to be supplied through the second wiring 62. Further for a case where the other component 55 is composed of a heating means (heat-generating resistor, etc.), the magnetic field shield 53 will contrary be heated so as to accelerate reduction in the magnetization, and this makes it possible to effect recording only to the magnetic storage element 60A located on the side provided with the other component 55, by properly adjusting amount of a current to be supplied through the second wiring 62.

While the embodiments shown in FIGS. 12 and 13 dealt with the cases where two magnetic field shields are connected to the second wiring 62 while keeping a parallel relation therebetween, it is also allowable to connect these two magnetic field shields in series similarly to the one as shown in FIG. 6 and to connect them to the second wiring 62. Because series connection ensures an identical amount of current to be applied to both components, the component having a larger resistivity ratio generates a larger amount of heat. In the configuration in which two magnetic field shields are connected to the second wiring while keeping a parallel relation therebetween, it is also allowable to adopt two magnetic field shields differing in the thickness.

It is still also allowable to use two magnetic field shields differing in a plurality of factors including the aforementioned dimensions (thickness, length, width), species of the soft magnetic materials, and presence or absence of the other component. In this case, it is preferable to adopt a configuration by which actions of the different factors are mutually enhanced rather than cancelled. It is still also allowable to configure the magnetic storage device using three or more magnetic storage elements respectively disposed with different magnetic field shields, so as to enable selective recording to each of the magnetic storage elements.

In other words, the magnetic storage device of the present invention may have a magnetic storage element group configured therein, where the magnetic storage element group comprises a plurality of the magnetic storage elements which are individually provided with the magnetic field shields differing in configurations (constituents) thereof from each other, and being configured so as to be heated by the second wiring provided in common. It is further possible to configure a magnetic storage device in which a large number of magnetic storage element groups individually composed of the same number of magnetic storage elements are disposed.

Information can be recorded in the magnetic storage device as follows. In the first step, all magnetic field shields in a certain magnetic storage element group are heated by the second wiring to lower or ruin their shielding ability, and the current-induced magnetic field is applied from the first wiring to thereby record the same magnetization information into the storage layers of all magnetic field storage elements in the magnetic storage element group. Direction of current to be supplied through the first wiring herein is preferably set corresponding to information to be recorded into a first magnetic storage element which corresponds with a magnetic field shield most unlikely to lower its shielding ability, where such a magnetic field shield is typified by the one having a magnetic transition temperature closest to the heating temperature. In the second step, amount of a current to be supplied through the second wiring is set to a smaller value so as to lower the temperature of the magnetic field shield, to thereby restore the shielding ability of the magnetic field shield only for the first magnetic storage element, and the current-induced magnetic field is then applied from the first wiring to thereby record magnetization information having the same direction in the individual storage layers of the magnetic storage elements other than the first element. Direction of current to be supplied through the first wiring herein is set corresponding to information to be recorded into a second magnetic storage element which corresponds with a magnetic field shield second most unlikely to lower its shielding ability.

Amount of the current to be supplied through the second wiring is similarly reduced also in the third step and thereafter so as to restore the shielding ability of the magnetic field shields one by one, to thereby reduce the number of the magnetic storage elements to be recorded with magnetization information. As a final consequence, all magnetic storage elements composing the magnetic storage element group can be recorded with arbitrary information. It is to be noted now that recording of alternating information such as 101010 needs recording steps repeated in a number of times same as that of the magnetic storage element composing the magnetic storage element group, but as for information such as 110001 in which the same data appear in succession, recording can be restarted only at the position where the data changes.

While heating of the magnetic field shield in the above-described embodiments is effected by electrifying the magnetic field shields 5, 35, 52, 53 directly from the second wirings 12, 42, 62, it is also allowable in the present invention to form a conductive film on the top or back surface of the magnetic field shield, and to electrify the conductive film to thereby heat the magnetic field shield.

In the above-described embodiments, the magnetic field is applied to the storage layers 1, 31A, 31B, 51A, 51B using the current-induced magnetic field generated by electrifying the first wirings 11, 41, 61. While the magnetic field applying means for applying magnetic field to the storage layer is most simple and effective when it is configured so as to generate the current-induced magnetic field by electrifying the wiring as described in the above, the present invention by no means limits the magnetic field applying means to those such as generating the current-induced magnetic field, and allows other configurations. For example, it is also allowable to configure the magnetic field applying means typically using a ferrimagnetic material capable of varying magnetization depending on temperature, and to vary the magnetization through temperature change to thereby vary magnitude of the magnetic field to be generated. It is still also allowable to configure the magnetic field applying means typically so that a soft magnetic material for concentrating magnetic flux is disposed on the back surface (a surface opposite to the storage layer) or on the side face of the wiring around which the current-induced magnetic field is to be generated.

While the above-described embodiments dealt with the case where the magnetic field shield composed of a soft magnetic material is disposed only in a portion located above the magnetic storage element, and the residual portions are occupied by the second wiring (composed of a good conductor such as Cu), it is also allowable in the present invention to compose the entire portion of the second wiring (e.g., word line) with a soft magnetic material.

While the individual embodiments described in the above dealt with magnetic tunnel junction element configured so that the magnetization-fixed layer is disposed relative to the storage layer while placing the tunnel insulating layer is between, so as to allow detection (read-out) of magnetization status of the storage layer, the present invention by no means limits the configuration for allowing detection of the magnetization state of the storage layer to the aforementioned magnetic tunnel junction elements, and allows other configurations (e.g., giant magnetoresistive (GMR) element, Hall element, etc.).

In the magnetic storage device of the present invention, control of the magnetic field to be applied to the storage layer of the magnetic storage element is attainable by either configurations in which the first wiring (e.g., bit line), the storage layer and the second wiring (e.g., word line) are disposed in this order, and in which the first wiring (e.g., bit line), the second wiring (e.g., word line) and the storage layer are disposed in this order. Among these, the configuration shown in FIG. 3 in which the first wiring (e.g., bit line) 11, the second wiring (e.g., word line) 12 and the storage layer 1 are disposed in this order, and the magnetic field shield 5 is further disposed between the magnetic field application means (first wiring 11) and the storage layer 1, is preferable in view of emphasizing changes in the magnetic field to be applied to the storage layer.

The present invention is by no means limited to the above-described embodiments, and other various configurations are allowable without departing from the essential spirit of the present invention.

What is claimed is:
1. A magnetic storage element comprising:
a storage layer for storing a magnetization state as information;
a magnetic field applying means for applying a magnetic field to said storage layer; and
a magnetic field shield, being disposed between said magnetic field applying means and said storage layer and comprising a soft magnetic material, for shielding at least a part of the magnetic field applied by said magnetic field applying means.

2. A recording method using a magnetic storage element, said magnetic storage element comprising:

a storage layer for storing a magnetization state as information;

a magnetic field applying means for applying a magnetic field to said storage layer; and a magnetic field shield, being disposed between said magnetic field applying means and said storage layer and comprising a soft magnetic material, for shielding at least a part of the magnetic field applied by said magnetic field applying means, wherein:

recording of the magnetization state to said storage layer is carried out by applying the magnetic field by said magnetic field applying means to said storage layer while heating said magnetic field shield to thereby allow it to reduce or lose at least a part of the magnetization of said magnetic field shield.

3. A magnetic storage device comprising:

a magnetic storage element comprising a storage layer for storing a magnetization state as information, a magnetic field applying means for applying a magnetic field to said storage layer, and a magnetic field shield, being disposed between said magnetic field applying means and said storage layer and comprising a soft magnetic material, for shielding at least a part of the magnetic field applied by said magnetic field applying means;

a first wiring; and a second wiring, wherein:

said magnetic storage element is disposed at an intersection of said first wiring and said second wiring, said first wiring configures said magnetic field applying means of said magnetic storage element, from said first wiring a current-induced magnetic field being applied to said storage layer, and said magnetic field shield is heated by said second wiring.

4. The magnetic storage device as claimed in claim 3, wherein said second wiring is electrically connected to said magnetic field shield.

5. The magnetic storage device as claimed in claim 3, having a magnetic storage element group configured therein, said magnetic storage element group comprising a plurality of said magnetic storage elements which are individually provided with said magnetic field shields differing in configurations thereof from each other, and being configured so as to be heated by said second wiring provided in common.

6. The magnetic storage device as claimed in claim 5, wherein said magnetic field shields differing in configurations thereof from each other differ in dimensions thereof.

7. The magnetic storage device as claimed in claim 5, wherein said magnetic field shields differing in configurations thereof from each other differ in species of the soft magnetic materials used therefor.

* * * * *